United States Patent
Xie et al.

(10) Patent No.: US 11,967,498 B2
(45) Date of Patent: Apr. 23, 2024

(54) SYSTEMS AND METHODS FOR DEPOSITING LOW-k DIELECTRIC FILMS

(71) Applicant: Applied Materials, Inc., Santa Clara, CA (US)

(72) Inventors: Bo Xie, San Jose, CA (US); Kang S. Yim, Palo Alto, CA (US); Yijun Liu, Santa Clara, CA (US); Li-Qun Xia, Cupertino, CA (US); Ruitong Xiong, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 43 days.

(21) Appl. No.: 16/914,960

(22) Filed: Jun. 29, 2020

(65) Prior Publication Data

US 2021/0407792 A1    Dec. 30, 2021

(51) Int. Cl.
*H01L 21/02* (2006.01)
*C23C 16/32* (2006.01)

(52) U.S. Cl.
CPC ...... *H01L 21/02126* (2013.01); *C23C 16/325* (2013.01); *H01L 21/02167* (2013.01);
(Continued)

(58) Field of Classification Search
CPC ......... H01L 21/02126; H01L 21/02167; H01L 21/02274; H01L 21/02205;
(Continued)

(56) References Cited

U.S. PATENT DOCUMENTS

| | | |
|---|---|---|
| 6,448,186 B1 | 9/2002 | Olson et al. |
| 6,716,770 B2 | 4/2004 | O'Neill et al. |

(Continued)

FOREIGN PATENT DOCUMENTS

| | | |
|---|---|---|
| CN | 1782125 A | 6/2006 |
| KR | 2019-0062135 A | 6/2019 |
| WO | 01-71776 A2 | 9/2001 |

OTHER PUBLICATIONS

International Search Report and Written Opinion dated Sep. 24, 2021 in International Patent Application No. PCT/US2021/037177, 10 pages.

(Continued)

*Primary Examiner* — Monica D Harrison
*Assistant Examiner* — Andre C Stevenson
(74) *Attorney, Agent, or Firm* — Kilpatrick Townsend & Stockton LLP

(57) ABSTRACT

Exemplary methods of forming a silicon-and-carbon-containing material may include flowing a silicon-oxygen-and-carbon-containing precursor into a processing region of a semiconductor processing chamber. A substrate may be housed within the processing region of the semiconductor processing chamber. The methods may include forming a plasma within the processing region of the silicon-and-carbon-containing precursor. The plasma may be formed at a frequency less than 15 MHz (e.g., 13.56 MHz). The methods may include depositing a silicon-and-carbon-containing material on the substrate. The silicon-and-carbon-containing material as-deposited may be characterized by a dielectric constant below or about 3.5 and a hardness greater than about 3 Gpa.

13 Claims, 3 Drawing Sheets

(52) U.S. Cl.
CPC ............... *H01L 21/02274* (2013.01); *H01L 21/02205* (2013.01); *H01L 21/02211* (2013.01); *H01L 21/02216* (2013.01)

(58) Field of Classification Search
CPC ......... H01L 21/02211; H01L 21/02216; H01L 21/31116; H01L 21/76814; H01L 21/321; H01L 21/02362; H01L 21/76877; H01L 21/3105; H01L 21/0217; H01L 23/53295; H01L 21/76831; H01L 21/02219; H01L 21/02178; H01L 21/76843; H01L 21/0228; H01L 23/53238; H01L 2924/0002; H01L 2924/00; C23C 16/325
See application file for complete search history.

(56) References Cited

U.S. PATENT DOCUMENTS

| | | | |
|---|---|---|---|
| 2002/0098684 A1* | 7/2002 | Li | H01L 21/02126 438/630 |
| 2019/0134663 A1 | 5/2019 | Lei et al. | |
| 2019/0318925 A1* | 10/2019 | Lei | H01L 21/02164 |
| 2020/0075321 A1 | 3/2020 | Mukherjee et al. | |
| 2020/0248309 A1* | 8/2020 | Wang | C07F 7/10 |
| 2021/0233768 A1* | 7/2021 | Sarkar | H01L 21/0332 |

OTHER PUBLICATIONS

Application No. PCT/US2021/037177, International Preliminary Report on Patentability, dated Jan. 12, 2023, 7 pages.

* cited by examiner

SYSTEMS AND METHODS FOR DEPOSITING LOW-k DIELECTRIC FILMS

TECHNICAL FIELD

The present technology relates to deposition processes and chambers. More specifically, the present technology relates to methods of producing low-k films that may not utilize UV treatments.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Exemplary methods of forming a silicon-oxygen-and-carbon-containing material may include flowing a silicon-oxygen-and-carbon-containing precursor into a processing region of a semiconductor processing chamber. A substrate may be housed within the processing region of the semiconductor processing chamber. The methods may include forming a plasma within the processing region of the silicon-oxygen-and-carbon-containing precursor. The plasma may be formed at a frequency below 15 MHz (e.g., 13.56 MHz). The methods may include depositing a silicon-oxygen-and-carbon-containing material on the substrate. The silicon-oxygen-and-carbon-containing material as-deposited may be characterized by a dielectric constant ranging from 3.0 to 3.3, and a hardness ranging from 3.5 GPa to 6.0 GPa.

In some embodiments, the silicon-oxygen-and-carbon-containing precursor may include oxygen. The silicon-and-carbon-containing precursor may be characterized by a carbon-to-silicon ratio greater than 1. The plasma may be formed at a frequency below 15 MHz. The silicon-oxygen-and-carbon-containing material as-deposited may be characterized by a dielectric constant below 3.5 (e.g., 3.0 to 3.3). The silicon-and-carbon-containing material as-deposited may be characterized by a hardness of greater than or about 3.5 Gpa. The silicon-and-carbon-containing material as-deposited may be characterized by a Young's modulus of greater than or about 5 Gpa. The silicon-and-carbon-containing material as-deposited may be characterized by a methyl incorporation less than or about 3% (e.g., 1.5% to 2.25%). The silicon-and-carbon-containing material as-deposited may be characterized by a percentage of Si—C—Si bonds, relative to the total silicon bonds, as ranging from 0.15% to 0.3%.

Some embodiments of the present technology may encompass methods of forming a silicon-and-carbon-containing material. The methods may include providing a deposition precursor into a processing region of a semiconductor processing chamber, wherein a substrate is housed within the processing region of the semiconductor processing chamber, and wherein the deposition precursor is characterized by Formula 1:

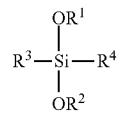

wherein in Formula 1,
$R^1$ may include a $C_1$-$C_6$ alkyl group, such as —$CH_3$, —$CH_2CH_3$, —$CH_2CH_2CH_3$, —$CH_2CH_2CH_2CH_3$, —$CH_2CH_2CH_2CH_2CH_3$, or —$CH_2CH_2CH_2CH_2CH_2CH_3$,
$R^2$ may include a $C_1$-$C_6$ alkyl group, such as —$CH_3$, —$CH_2CH_3$, —$CH_2CH_2CH_3$, —$CH_2CH_2CH_2CH_3$, —$CH_2CH_2CH_2CH_2CH_3$, or —$CH_2CH_2CH_2CH_2CH_2CH_3$,
$R^3$ may include —$OCH_3$, —$CH_3$, —H, —$(CH_2)_nCH_3$, —$O(CH_2)_nCH_3$, —$CH=CH_2$, —$CH_2$—$CH_2$—$(CH_2CH_3)_2$, or —$CH_2$—$CH(CH_3)_2$, and
$R^4$ may include —$OCH_3$, —$CH_3$, —H, —$(CH_2)_nCH_3$, —$O(CH_2)_nCH_3$, —$CH=CH_2$, —$CH_2$—$CH_2$—$(CH_2CH_3)_2$, or —$CH_2$—$CH(CH_3)_2$.
The method may include forming a plasma within the processing region of the deposition precursor. The plasma may be formed at a frequency below 15 MHz. The methods may include depositing a silicon-and-carbon-containing material on the substrate. The silicon-and-carbon-containing material as-deposited may be characterized by a dielectric constant below 3.5 and a hardness ranging from 3.5 GPa to 6.0 GPa.

In some embodiments, the deposition precursor may be characterized by ratio of carbon to silicon of greater than or about 3. The deposition precursor may be characterized by ratio of oxygen to silicon of greater than or about 1.5. The silicon-and-carbon-containing material as-deposited may be characterized by a dielectric constant below or about 3.5. The silicon-and-carbon-containing material as-deposited may be characterized by a hardness of greater than or about 3 Gpa. The silicon-and-carbon-containing material as-deposited may be characterized by a Young's modulus of greater than or about 5 Gpa. The silicon-and-carbon-containing material as-deposited may be characterized by a methyl incorporation less than or about 3%. The silicon-and-carbon-containing material as-deposited may be characterized by a percentage of Si—C—Si bonds, relative to the total silicon bonds, as ranging from 0.15% to 0.3%.

Some embodiments of the present technology may encompass methods of forming a silicon-and-carbon-containing material. The methods may include flowing a silicon-and-carbon-and-oxygen-containing precursor into a processing region of a semiconductor processing chamber. A substrate may be housed within the processing region of the semiconductor processing chamber. The methods may include forming a plasma within the processing region of the silicon-and-carbon-and-oxygen-containing precursor. The plasma may be formed at a frequency below 15 MHz. The methods may include depositing a silicon-and-carbon-containing material on the substrate. The silicon-and-carbon-containing material as-deposited may be characterized by a dielectric constant below 3.5.

In some embodiments, the silicon-and-carbon-containing material as-deposited is characterized by a hardness of greater than or about 3 Gpa. The silicon-and-carbon-containing material as-deposited may be characterized by a Young's modulus of greater than or about 5 Gpa. The silicon-and-carbon-containing material as-deposited may be characterized by a methyl incorporation less than or about 3%. The silicon-and-carbon-containing material as-deposited may be characterized by a percentage of Si—C—Si bonds, relative to the total silicon bonds, as ranging from 0.15% to 0.3%.

Such technology may provide numerous benefits over conventional systems and techniques. For example, utilizing higher frequency power may improve deposition characteristics. Additionally, reducing the low-k formation to a single-chamber process may reduce production costs, cost of ownership, and production queue times. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
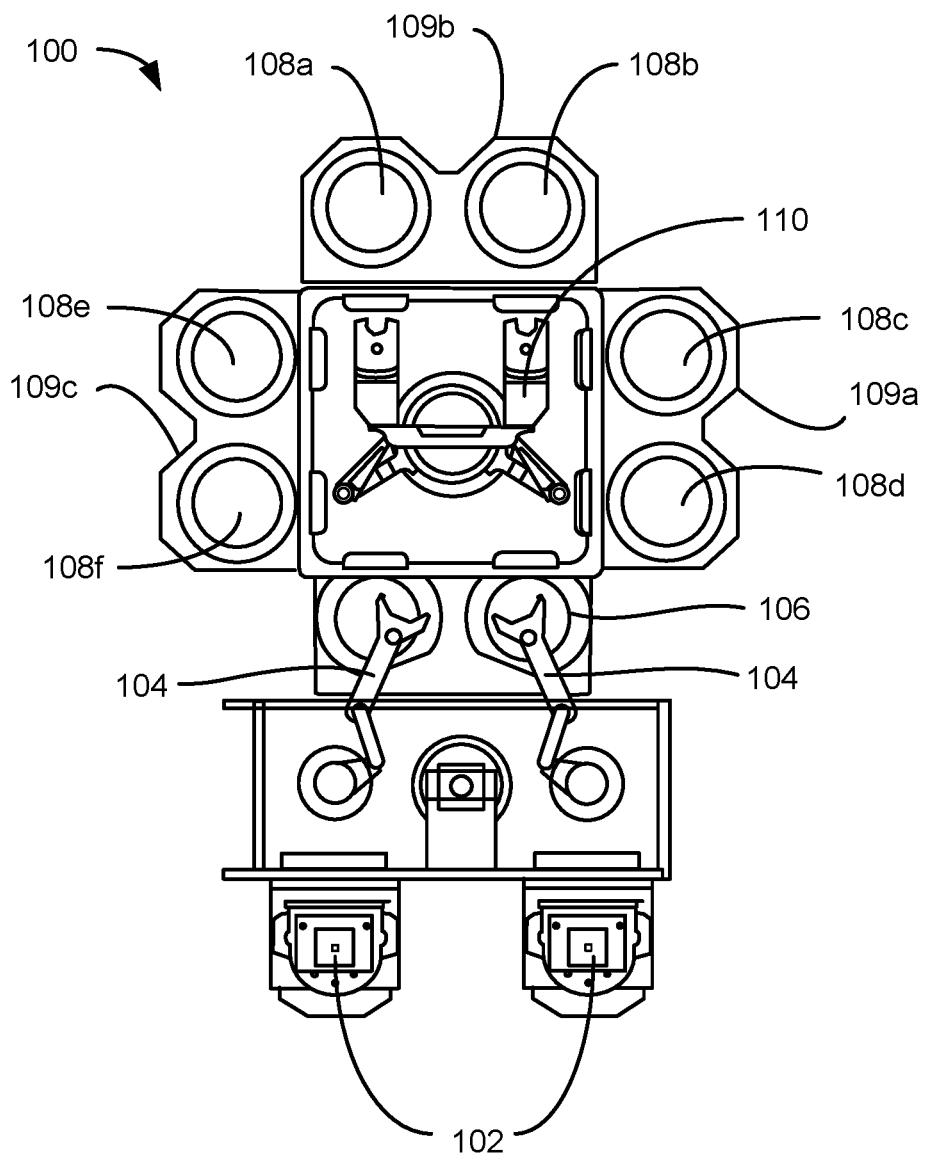
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During back-end-of-line semiconductor processing, structures may be produced to facilitate metallization, such as dual-damascene structures. These structures may be produced with several processing steps utilizing masking and low-k films, which may be processed and removed. The removal may be performed with chemical-mechanical processes which include an amount of physical abrasion of the materials for removal. Low-k films may be characterized by relatively lower hardness and tensile modulus, which may cause limit their effectiveness during polishing, as the high sheer stresses during polishing may crack low-k films and lead to device failure. To improve hardness while maintaining lower k values, many conventional technologies are forced to include additional processing steps like UV curing to improve hardness of the films. These additional processes may greatly reduce throughput and often require additional processing chambers on the tool.

The present technology may overcome these issues be providing low-k films that, as deposited, may be characterized by higher hardness. By performing deposition at higher temperature with particular precursors characterized by particular oxygen-to-carbon ratios may increase silicon-and-oxide bonding within the film, while maintaining required ratios of carbon moieties to maintain reduced dielectric constant. This may overcome the natural tendency of dielectric constant to rise with modulus and hardness, while also reducing the number of operations required during processing. In particular, the present technology may not utilize subsequent processing after deposition, including UV exposure, plasma treatment, or other processing operations to post-treat the film to improve hardness.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
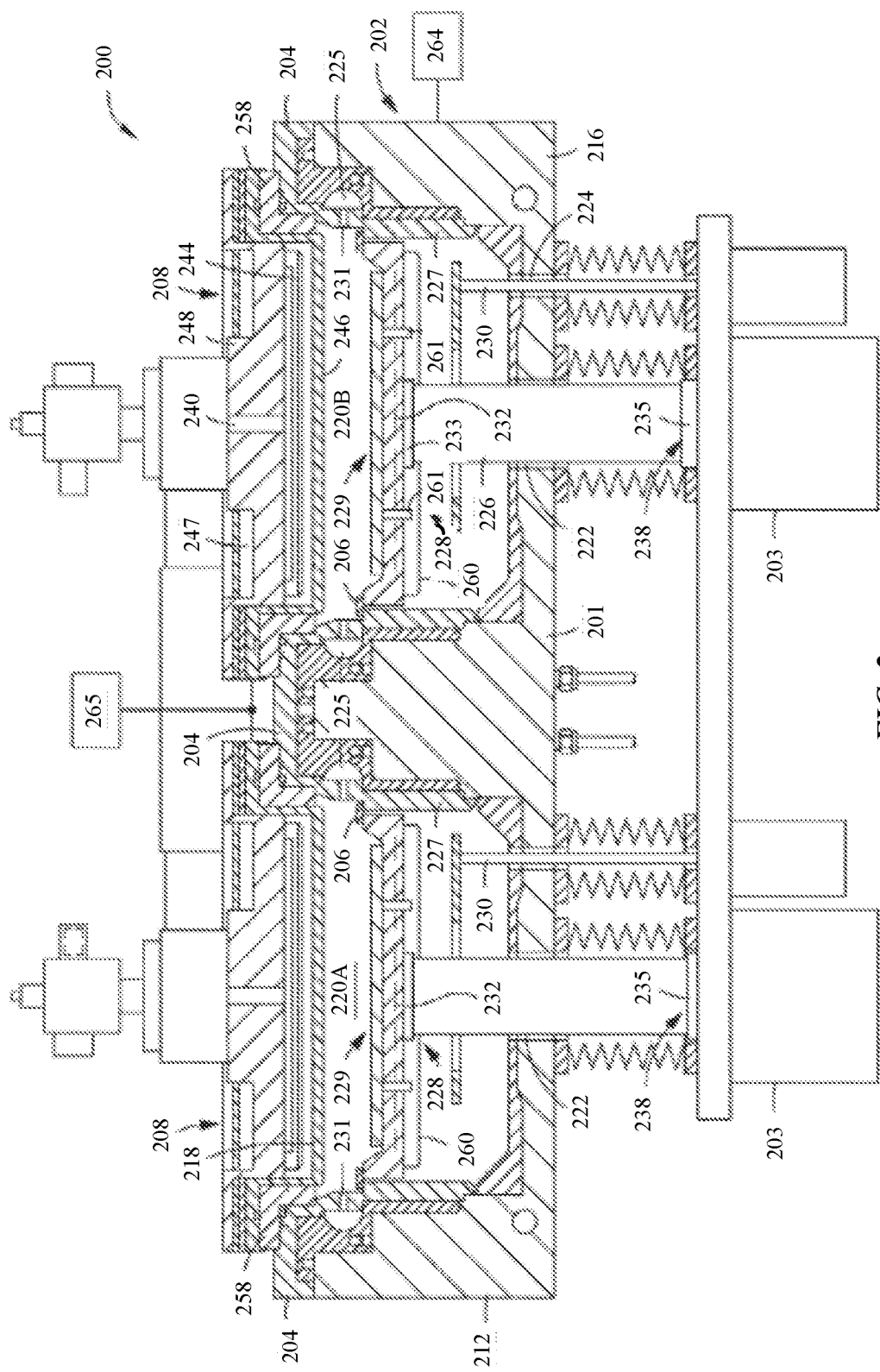
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
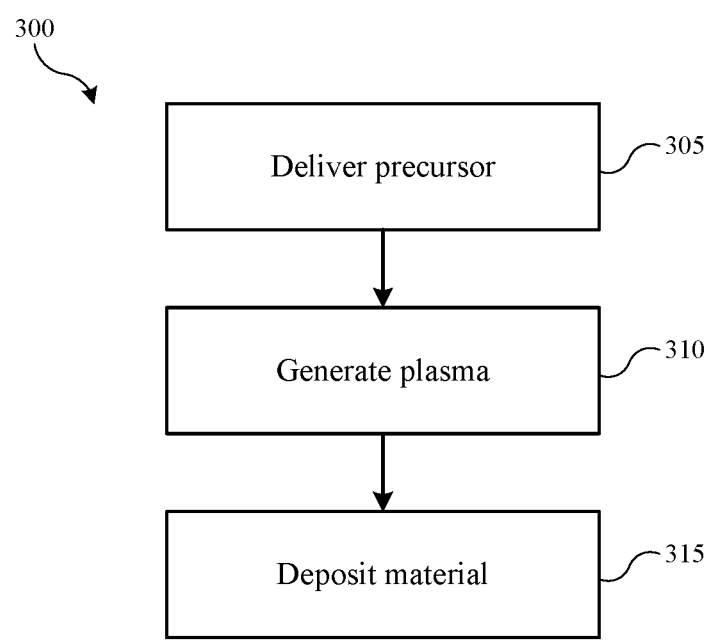
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology.

Method 300 may include PECVD processing operations to form low-k, high-hardness, silicon-oxygen-and-carbon-containing materials as-deposited on a substrate without the need for a post-deposition treatment (e.g., UV curing) to achieve the low-k and high-hardness properties of the material. The method may include optional operations prior to initiation of method 300, or the method may include additional operations after the deposition of the low-k, high-hardness material. Method 300, as shown in FIG. 3, may include flowing one or more precursors into a processing chamber at operation 305, which may deliver the precursor or precursors into a processing region of the chamber where a substrate may be housed, such as region 220, for example.

In some embodiments, the precursor may be or include a silicon-oxygen-and-carbon-containing precursor for producing a low-k, high-hardness silicon-oxygen-and-carbon-containing material. The precursors may or may not include delivery of additional precursors, such as carrier gases and/or one or oxygen gas. In some embodiments, the deposition precursor may utilize a single silicon-oxygen-and-carbon-containing deposition precursor. Although a carrier gas, such as an inert precursor, may be delivered with the deposition precursor, additional precursors intended to react with the deposition precursor and produce deposition products may not be used. Exemplary carrier gases may include at least one of helium and nitrogen ($N_2$).

Deposition precursors may include precursors having Si—O bonds and Si—C bonds, and may include linear branched precursors, cyclic precursors, or any number of additional precursors. In some embodiments the precursors may be characterized by certain ratios of carbon and/or oxygen to silicon. For example, in some embodiments a ratio of either carbon or oxygen to silicon may be greater than or about 1, and may be greater than or about 1.5, greater than or about 2, greater than or about 2.5, greater than or about 3, greater than or about 3.5, greater than or about 4, or more. By increasing the amount of carbon or oxygen relative to silicon, additional incorporation within the film of residual moieties or molecules may be increased. This may improve material properties, as well as lower a dielectric constant as will be described further below.

In a description of a specific embodiment above, the silicon-oxygen-and-carbon-containing deposition precursor was specified as having a central silicon atom and at least one methyl group and at least one methoxy group bonded to the central silicon. Specific examples of these methyl-methoxy-siloxane precursors included DMDMOS, TMMOS, and MTMOS. The present technology contemplates the use of additional deposition precursors that may replace or complement the specific precursor examples listed above. These additional precursors may include at least on silicon atom, at least one silicon-and-alkyl group bond, and at least one silicon-and-alkoxy group bond. In some examples, such as where there is a single silicon atom, the alky group and the alkoxy group are both bonded to the same silicon atom. In additional examples, at least one silicon atom has at least one silicon-and-alkyl group bonds, and at least one other silicon atom has at least one silicon-and-alkoxy group bond. The DMDMOS, TMMOS, and MTMOS precursors describe above have methyl groups as the alkyl group, and methoxy groups as the alkoxy groups. Additional precursors may have alkyl groups such as ethyl, propyl, butyl, pentyl, and/or hexyl groups, in addition to, or in lieu of, one or more methyl groups. Similarly, additional precursors may have alkoxy groups such as ethoxy, propoxy, butoxy, pentoxy, and/or hexoxy groups, in addition to, or in lieu of, one or more methoxy groups. Additional embodiments of exemplary deposition precursors may include those having Formula 1:

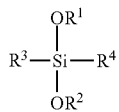

wherein in Formula 1,
$R^1$ may include a $C_1$-$C_6$ alkyl group, such as —$CH_3$, —$CH_2CH_3$, —$CH_2CH_2CH_3$, —$CH_2CH_2CH_2CH_3$, —$CH_2CH_2CH_2CH_2CH_3$, or —$CH_2CH_2CH_2CH_2CH_2CH_3$,
$R^2$ may include a $C_1$-$C_6$ alkyl group, such as —$CH_3$, —$CH_2CH_3$, —$CH_2CH_2CH_3$, —$CH_2CH_2CH_2CH_3$, —$CH_2CH_2CH_2CH_2CH_3$, or —$CH_2CH_2CH_2CH_2CH_2CH_3$,
$R^3$ may include —$OCH_3$, —$CH_3$, —H, —$(CH_2)_nCH_3$, —$O(CH_2)_nCH_3$, —$CH=CH_2$, —$CH_2$—$CH_2$—$(CH_2CH_3)_2$, or —$CH_2$—$CH(CH_3)_2$, where n=1 to 5, and
$R^4$ may include —$OCH_3$, —$CH_3$, —H, —$(CH_2)_nCH_3$, —$O(CH_2)_nCH_3$, —$CH=CH_2$, —$CH_2$—$CH_2$—$(CH_2CH_3)_2$, or —$CH_2$—$CH(CH_3)_2$, where n=1 to 5.

Embodiments of the present methods include forming a material from a plasma effluent made from one or more deposition precursors described by Formula 1. The material formed may be a silicon-oxygen-and-carbon-containing material, such as carbon-doped silicon oxide. Additional examples of silicon-oxygen-and-carbon-containing precursors that may be used to form a plasma effluent and deposit the present silicon-oxygen-and-carbon-containing materials on a substrate are provide below. These exemplary precursors may be provided as a single precursor, or may be combined as two or more precursors to make the deposition precursor that forms the plasma effluent:

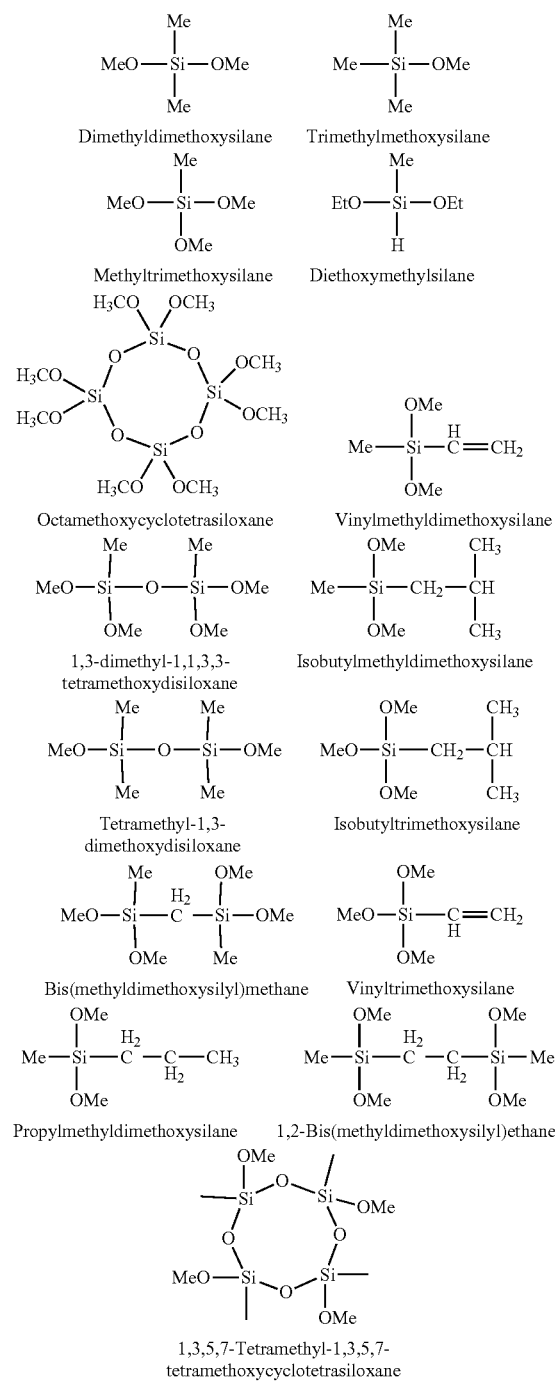

Although any of the noted precursors may be utilized, in some embodiments the precursors may be characterized by a carbon-to-oxygen ratio that is less than or about 4:1, to facilitate higher hardness values. For example, in some embodiments the precursor may be characterized by a carbon-to-oxygen ratio that is less than or about 3:1, less than or about 2:1, less than or about 4:3, or less. Optionally, an additional amount of oxygen may be flowed with the silicon precursor to further adjust or maintain a ratio of oxygen to carbon within the film being formed. At operation 310, a plasma may be generated of the precursors within the processing region, such as by providing RF power to the faceplate to generate a plasma within processing region 220, although any other processing chamber capable of producing plasma may similarly be used. The plasma may be generated at any of the frequencies previously described, and may be generated at a frequency less than 15 MHz (e.g., 13.56 MHz). Although higher frequency may be used, in some embodiments the lower frequency plasma generation may facilitate removal of carbon during processing, unlike higher plasma frequency operations.

As noted above, the plasma effluent may be introduced to a heated substrate to facilitate an as-deposited material with low-k and high-hardness. The deposition may be performed at substrate temperatures greater than or about 300° C., which may improve release of carbon from the film, as well as cross-linking of silicon and oxygen chains within the material network. As will be explained further below, while some carbon aspects may be beneficial to the film, others may be less beneficial to the material produced. Accordingly, by increasing the deposition temperature, film properties may be improved. Consequently, in some embodiments the depositions may occur at substrate temperatures greater than or about 350° C., greater than or about 375° C., greater than or about 400° C., greater than or about 425° C., greater than or about 450° C., greater than or about 475° C., greater than or about 500° C., or higher. Particularly for precursors characterized by reduced carbon incorporation relative to oxygen incorporation, higher temperature may facilitate breaking weaker Si—C—Si bonds relative to silicon-and-oxygen bonding, which may reduce carbon incorporation within the film and provide increased hardness over conventional films. As explained below, this may be controlled to maintain an amount of carbon incorporation to maintain a lower dielectric constant for the film.

Material formed in the plasma may be deposited on the substrate at operation 315, which may produce a silicon-oxygen-and-carbon-containing material. In some embodiments the deposition rate may exceed 500 Å/min, and may be deposited at a rate greater than or about 700 Å/min, greater than or about 1,000 Å/min, greater than or about 1,200 Å/min, greater than or about 1,400 Å/min, greater than or about 1,600 Å/min, greater than or about 1,800 Å/min, greater than or about 2,000 Å/min. After deposition to a sufficient thickness, many conventional processes may then transfer the substrate to a second chamber to perform a treatment, such as a UV treatment or other post-deposition treatment. This may reduce throughput, and may increase production costs by requiring an additional chamber or tool to perform the treatment. The present technology, however, may produce materials, including carbon-doped silicon oxide, which may be characterized by sufficient material properties as deposited, and without additional treatments, such as a UV treatment. Although embodiments of the present technology may encompass additional treatments subsequent deposition, the as-deposited characteristics of the film may include a range of improvements over conventional technology.

As explained above, conventional technologies operating at lower plasma frequencies may cause an amount of ion bombardment that may otherwise release carbon-containing materials from the deposited materials, which may increase the dielectric constant of the film. By utilizing higher plasma frequencies, along with precursors according to the present technology, low-k dielectric materials may be produced that may be characterized by a dielectric constant of less than or about 3.5, and may be less than or about 3.45, less than or about 3.4, less than or about 3.35, less than or about 3.3, less than or about 3.25, less than or about 3.2, less than or about 3.15, less than or about 3.1, less than or about 3.05, less than or about 3.0, or less.

Dielectric constant may be related to material properties of the material, where the lower the dielectric constant (i.e., k-value), the lower the Young's modulus and/or hardness of the as-deposited material. By producing silicon-oxygen-and-carbon-containing materials according to embodiments of the present technology, hardness and modulus of the as-deposited low-k material may be higher than would otherwise occur with conventional PECVD deposition methods. For example, in some embodiments, the present technology may produce materials characterized by a Young's modulus of greater than or about 5.0 Gpa, and may be characterized by a Young's modulus of greater than or about 5.5 Gpa, greater than or about 6.0 Gpa, greater than or about 6.5 Gpa, greater than or about 7.0 Gpa, greater than or about 7.5 Gpa, greater than or about 8.0 Gpa, greater than or about 8.5 Gpa, greater than or about 9.0 Gpa, greater than or about 9.5 Gpa, greater than or about 10.0 Gpa, or higher. Similarly, the present technology may produce materials characterized by a hardness of greater than or about 3 Gpa, and may be characterized by a hardness of greater than or about 3.5 Gpa, greater than or about 4 Gpa, greater than or about 4.5 Gpa, greater than or about 5 Gpa, greater than or about 5.5 Gpa, greater than or about 6 Gpa, greater than or about 6.5 Gpa, greater than or about 7 Gpa, greater than or about 7.5 Gpa, greater than or about 8 Gpa, greater than or about 10 Gpa, or higher. Consequently, the present technology may produce silicon-oxygen-and-carbon-containing material characterized by a low dielectric constant and high modulus and hardness characteristics.

The material characteristics produced by embodiments of the present technology may be related to an amount of methyl groups incorporated into the film, as well as an amount of non-methyl carbon incorporated within the film, such as $CH_2$ or CH, bonded within the material. The processing may release an amount of these materials. For example, in some embodiments, as-deposited materials produced according to the present technology may be characterized by a methyl or $CH_3$ percentage incorporated or retained within the material of greater than or about 1%, which may impact both dielectric constant as well as hardness, and may facilitate increased hardness. Accordingly, in some embodiments the as-deposited film may be characterized by a methyl incorporation within the film of greater than or about 1.25%, greater than or about 1.5%, greater than or about 1.75%, greater than or about 1.85%, greater than or about 1.95%, greater than or about 2%, greater than or about 2.1%, greater than or about 2.2%, greater than or about 2.25%, greater than or about 2.5%, greater than or about 3%, greater than or about 3.5%, or higher.

Additionally, a percentage of SiCSi may be less than or about 1% in the as-deposited materials, and may be less than or about 0.9%, less than or about 0.8%, less than or about 0.7%, less than or about 0.6%, less than or about 0.5%, less than or about 0.4%, less than or about 0.3%, less than or about 0.2%, less than or about 0.1%, less than or about 0.075%, less than or about 0.05%, less than or about 0.025%, or less, which may help reduce the dielectric constant relative to the hardness. However, by maintaining an amount of SiCSi bonding, dielectric constant may be lowered while hardness is increased, and accordingly in some embodiments the SiCSi percentage may be maintained greater than or about 0.1% and may be maintained greater than or about 0.15%, or higher. By utilizing silicon-oxygen-and-carbon-containing precursors and the processing characteristics with higher oxygen-incorporation relative to carbon incorporation according to embodiments of the present technology, low-k dielectric materials may be produced, which may be characterized by increased hardness and Young's modulus values, among other material properties.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a silicon-and-carbon-containing material, the method comprising:
flowing a silicon-oxygen-and-carbon-containing precursor into a processing region of a semiconductor processing chamber, wherein a substrate is housed within the processing region of the semiconductor processing chamber, and wherein the silicon-oxygen-and-carbon-containing precursor characterized by a carbon-to-oxygen ratio that is less than 4:1;
forming a plasma within the processing region of the silicon-oxygen-and-carbon-containing precursor, wherein the plasma is formed at a frequency below 15 MHz; and
depositing a silicon-and-carbon-containing material on the substrate, wherein the silicon-and-carbon-containing material as-deposited is characterized by a dielectric constant below 3.5, wherein a deposition rate of the silicon-and-carbon-containing material is greater than 500 Å/min, and wherein the silicon-and-carbon-containing material as-deposited is characterized by a methyl incorporation less than 2.5%.

2. The method of forming a silicon-and-carbon-containing material of claim 1, wherein the method further comprises flowing oxygen ($O_2$) gas into the processing region of the semiconductor processing chamber.

3. The method of forming a silicon-and-carbon-containing material of claim 1, wherein the silicon-and-carbon-containing material as-deposited is characterized by a hardness of greater than 3 Gpa.

4. The method of forming a silicon-and-carbon-containing material of claim 1, wherein the silicon-and-carbon-containing material as-deposited is characterized by a dielectric constant ranging from 3.1 to 3.3.

5. The method of forming a silicon-and-carbon-containing material of claim 1, wherein the silicon-and-carbon-containing material as-deposited is characterized by a hardness of greater than 5 Gpa.

6. The method of forming a silicon-and-carbon-containing material of claim 1, wherein the silicon-and-carbon-containing material as-deposited is characterized by a Young's modulus of greater than 5 Gpa.

7. The method of forming a silicon-and-carbon-containing material of claim 1, wherein the silicon-and-carbon-containing material as-deposited is characterized by a Si—C—Si bond incorporation less than 0.5%.

8. The method of forming a silicon-and-carbon-containing material of claim 1, wherein the silicon-oxygen-and-carbon-containing precursor is characterized by ratio of oxygen to silicon of greater than 2:1.

9. The method of forming a silicon-and-carbon-containing material of claim 1, wherein a deposition rate of the silicon-and-carbon-containing material is greater than 1,000 Å/min.

10. The method of forming a silicon-and-carbon-containing material of claim 1, wherein the silicon-oxygen-and-carbon-containing precursor comprises a central silicon atom and at least one methyl group and at least one methoxy group bonded to the central silicon.

11. A method of forming a silicon-and-carbon-containing material, the method comprising:
flowing a silicon-oxygen-and-carbon-containing precursor into a processing region of a semiconductor processing chamber, wherein a substrate is housed within the processing region of the semiconductor processing chamber;
forming a plasma within the processing region of the silicon-oxygen-and-carbon-containing precursor, wherein the plasma is formed at a frequency less than 13.56 MHz; and
depositing a silicon-and-carbon-containing material on the substrate, wherein the silicon-and-carbon-containing material as-deposited is characterized by a dielectric constant below 3.5 and a hardness of greater than 3 Gpa, wherein a deposition rate of the silicon-and-carbon-containing material is greater than 500 Å/min, and wherein the silicon-and-carbon-containing material as-deposited is characterized by a methyl incorporation less than 2.5%.

12. The method of forming a silicon-and-carbon-containing material of claim 11, wherein the silicon-and-carbon-containing material as-deposited is characterized by a Young's modulus of greater than 5 Gpa.

13. The method of forming a silicon-and-carbon-containing material of claim 11, wherein the silicon-and-carbon-containing material as-deposited is characterized by a Si—C—Si bond incorporation less than 0.5%.

* * * * *